(12) United States Patent
Du Pau et al.

(10) Patent No.: US 7,692,174 B2
(45) Date of Patent: Apr. 6, 2010

(54) METHOD AND APPARATUS FOR DETERMINING A RELATIVE POSITION OF A PROCESSING HEAD WITH RESPECT TO A SUBSTRATE WITH A STRUCTURE

(75) Inventors: Cornelis Petrus Du Pau, Eindhoven (NL); Peter Brier, Eindhoven (NL); Franciscus Cornelius Dings, Veldhoven (NL)

(73) Assignee: OTB Groups B.V., Eindhoven (NL)

( * ) Notice: Subject to any disclaimer, the term of this patent is extended or adjusted under 35 U.S.C. 154(b) by 0 days.

(21) Appl. No.: 11/990,088

(22) PCT Filed: Sep. 29, 2006

(86) PCT No.: PCT/NL2006/000487
§ 371 (c)(1),
(2), (4) Date: Jun. 17, 2008

(87) PCT Pub. No.: WO2007/037683
PCT Pub. Date: Apr. 5, 2007

(65) Prior Publication Data
US 2009/0134347 A1   May 28, 2009

(30) Foreign Application Priority Data
Sep. 29, 2005   (NL) .................................... 1030063

(51) Int. Cl.
*G01N 21/86* (2006.01)
*G01V 8/00* (2006.01)

(52) U.S. Cl. .................................... 250/559.29; 347/16

(58) Field of Classification Search ............ 250/559.29; 347/14–19
See application file for complete search history.

(56) References Cited

U.S. PATENT DOCUMENTS 5,867,590 A   2/1999   Eylon et al.
5,915,864 A   6/1999   Austin et al.

FOREIGN PATENT DOCUMENTS

DE   198 40 301 A1   3/2000
EP   1 351 325 A1   10/2003

*Primary Examiner*—Seung C Sohn
(74) *Attorney, Agent, or Firm*—Birch, Stewart, Kolasch & Birch, LLP

(57) ABSTRACT

A method and apparatus wherein a substrate is provided with a preformatted structure, with structural elements arranged in a matrix, wherein the matrix extends in an X-direction and Y-direction, wherein a processing head is provided, wherein a camera is provided which is connected with the processing head and which comprises at least one series of sensors arranged along a main line, wherein the camera scans the substrate and thereby provides at least one one-dimensional camera signal, wherein, for real-time determining at least the X-position and the Y-position of the structure with respect to the camera, the said main line includes an angle with the X-direction and with the Y-direction, wherein the angle is chosen such that the camera signal contains spatially separated X-position information and Y-position information and that the X-position information and the Y-position information can be separated from the sensor signal with the aid of signal processing.

29 Claims, 2 Drawing Sheets

Figure 1:
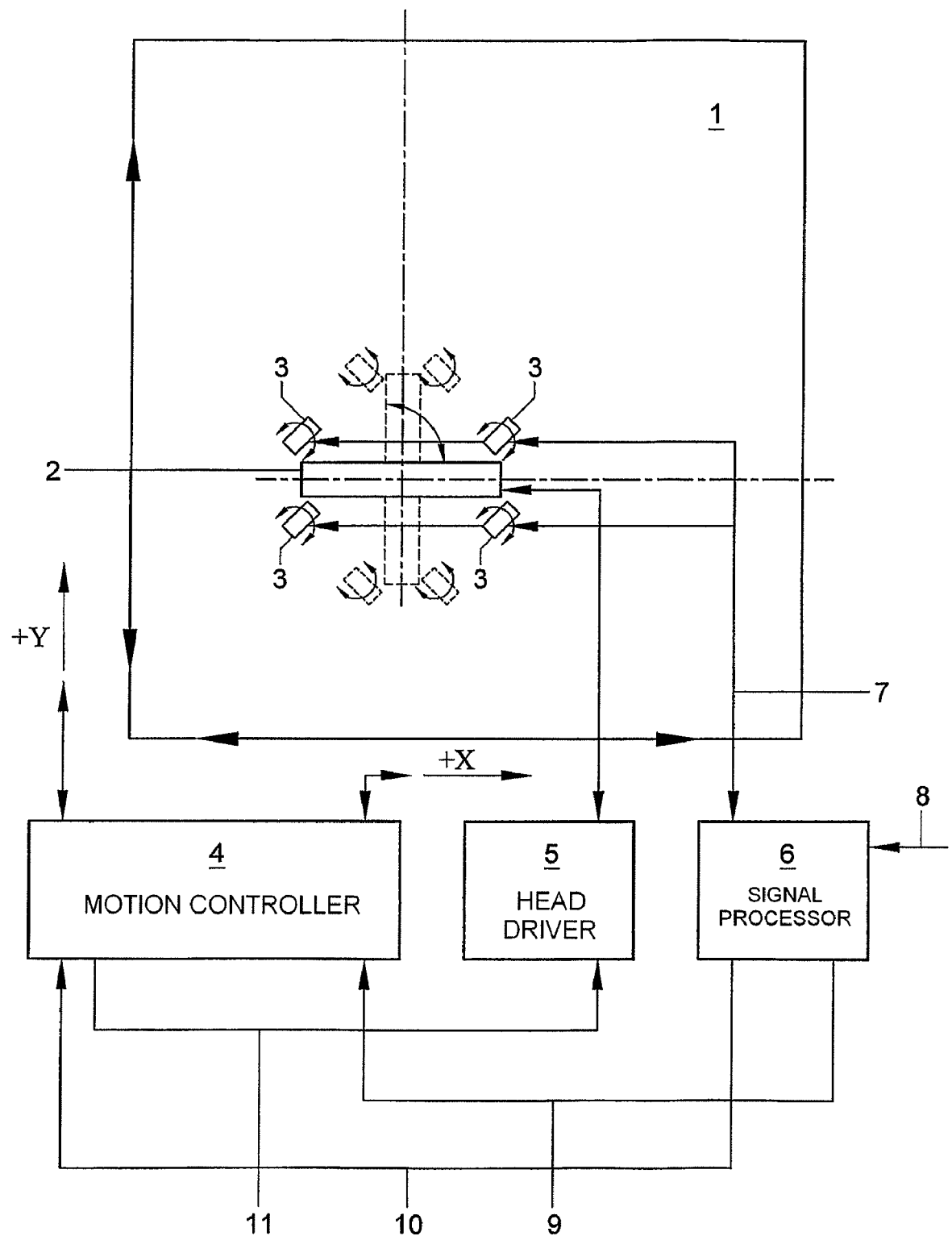

METHOD AND APPARATUS FOR DETERMINING A RELATIVE POSITION OF A PROCESSING HEAD WITH RESPECT TO A SUBSTRATE WITH A STRUCTURE

The invention relates to a method and an apparatus for determining the relative position of a processing head with respect to a substrate with a preformatted structure, with structural elements arranged in a matrix, wherein the matrix extends in an X-direction and Y-direction. The structure may be a relief structure but may also be a printing which provides a color difference structure on the substrate.

Although the invention is not limited thereto, in order to give a better idea, this should particularly be understood to involve substrate dimensions of at least 10 mm*10 mm, while the structural elements, such as for instance pixel wells of a substrate intended for manufacturing an OLED, have dimensions of the order of 20-500 micrometers, and while the distance between the structural elements is in the range of 2-40 micrometers. With regard to the accuracy with which the relative position of the substrate with respect to the processing head is to be provided, this should be understood to involve an accuracy which is of the order of 1 micrometer. For this, it likewise holds that the invention is not limited to such accuracies.

Observing the position of a structure on a substrate is, for instance, carried out with the manufacture of displays, for instance OLEDs. For this, see for instance EP-A-1 351 325. With the manufacture of a display or another type of device, determining the position of, for instance, a relief structure is important for inter alia controlling a reading and/or writing laser or for controlling an inkjet printer head. A great accuracy is desired to have new structures fit to the existing structures as well as possible, so that the quality of the display or the other type of device is as high as possible. The problem with finding a position of a structure already present is that the accuracy of positioning sometimes leaves much to be desired. When the position of a structure already present on the substrate has not been determined accurately, a next layer on the substrate cannot be applied accurately. This results in a reduced quality of the display or other type of device and therefore in extra rejects in the production, which is unfavorable to the production costs.

The present invention contemplates a method with the aid of which the position of a structure on a substrate can be observed in a simple manner, while this is done very accurately, while the method for observation can be carried out quickly and inexpensively.

To this end, the invention provides a method wherein a substrate is provided with a preformatted structure, with structural elements arranged in a matrix, wherein the matrix extends in an X-direction and Y-direction, wherein a processing head is provided, wherein a camera is provided which is connected with the processing head and which comprises at least one series of sensors arranged along a main line, wherein the camera scans the substrate and thereby provides at least one one-dimensional camera signal, wherein, for real-time determining at least the X-position and the Y-position of the structure with respect to the camera, the above-mentioned main line includes an angle with the X-direction and with the Y-direction, while the angle is chosen such that the camera signal contains spatially separated X-position information and Y-position information and that the X-position information and the Y-position information can be separated from the sensor signal with the aid of signal processing.

The invention further provides an apparatus for observing a structure on a substrate and for carrying out an operation on a substrate, which substrate is provided with a preformatted structure, with structural elements arranged in a matrix, wherein the matrix extends in an X-direction and Y-direction, wherein the apparatus is provided with a substrate support and with a processing head, wherein a displacement mechanism is provided for relative displacement of the processing head with respect to the substrate, wherein, with the processing head, at least one camera is connected which comprises at least one series of sensors arranged along a main line, wherein the camera is operatively displaced with respect to the substrate and thereby scans the substrate for providing at least one one-dimensional camera signal, wherein, for real-time determining at least the X-position and the Y-position of the structure with respect to the camera, the above-mentioned main line includes an angle with the X-direction and with the Y-direction, wherein the angle is chosen such that the camera signal contains spatially separated X-position information and Y-position information, wherein the apparatus is provided with a control which is provided with a signal-processing module which is arranged for separating the X-position information and the Y-position information from the sensor signal with the aid of signal processing.

With this method and apparatus, as a result of the fact that the main line of the camera includes an angle with the X-direction and with the Y-direction, a large number of structural element boundaries are located below the main line of the camera. These are structural element boundaries extending in X-direction as well as in Y-direction. The positions of the intersections of the structural element boundaries and the line camera are spatially separated over the length of the main line of the camera. In the further signal processing, all these spatially separated position information can be used for determining the relative X-position and the relative Y-position of the structure with respect to the camera. As a result, a very good signal-to-noise ratio (SNR) is obtained with the measurements and, in addition, a great accuracy is obtained with the position determination of the relative X-position and the relative Y-position.

According to a further elaboration of the method and the apparatus, the angle of the main line with respect to the X-direction and the Y-direction is chosen or set such that the camera operatively provides m spatially separated X-signals and n spatially separated Y-signals. Preferably, therein, m and n are mutually different prime numbers. Preferably, the signal-processing module of the apparatus is arranged for accurately deriving the relative X-position and Y-position of the at least one camera with respect to the substrate with the aid of signal processing comprising a fast Fourier transformation (FFT). Instead of a fast Fourier transformation, the signal processing may also comprise a discrete sine/cosine transformation. Here, the frequencies corresponding with the m spatially separated X-signals and the n spatially separated Y-signals will then be subjected to such a sine/cosine transformation in order to derive the relative X-position and Y-position with respect to the camera therefrom. In particular when m and n are mutually different prime numbers, there will be little cross talk in the signal between the X-position information-providing pulses and the Y-position information-providing pulses and therefore deriving the X-position information and the Y-position information can be done relatively simply and accurately.

According to a further elaboration, a method and an apparatus are provided wherein the relative X-position of the substrate structure with respect to the camera is derivable from the $m^{th}$ result of the FFT processing of the camera signal and wherein the relative Y-position of the substrate structure with respect to the camera is derivable from the $n^{th}$ result of the FFT processing. Here, m is the number of spatially separated structural element boundaries extending in Y-direction which are simultaneously observed by the camera and n is the number of spatially separated structural element boundaries extending in X-direction which are simultaneously observed by the camera.

Preferably, during a scanning pass, in which the relative X-position and Y-position are determined, further, an operation on the substrate is carried out with the processing head. This operation may, for instance, comprise an inkjet printer operation, a lighting, an ablation operation, and/or placing components on the substrate.

According to a further elaboration of the invention, the X-position information, which is derived from the camera signal, is used for correcting the relative X-position of the processing head with respect to the substrate.

According to a still further elaboration of the invention, the Y-position information, which is derived from the camera signal, is used for timing the operation, such as for instance timing the release of liquid by an inkjet printer head, the timing of the lighting by a lighting processing head, the timing of an ablation operation and/or the timing of the release of components.

According to a further elaboration of the invention, the processing head is rotatable about a centerline extending at right angles to the substrate. It can thus be realized that the pitch in X-direction of, for instance, the nozzles of a processing head designed as an inkjet printer head is geared to the pitch of the substrate structure in X-direction.

According to a still further elaboration of the invention, the at least one camera is preferably rotatable with respect to the processing head about a centerline extending at right angles to the substrate. Thus, the angle of the above-mentioned main line of the camera can be set such that the camera signal contains spatially separated X-position information and Y-position information.

Preferably, the camera is a line camera. Such line cameras comprise a series of sensors arranged in line, for instance 1024 sensors together forming a line sensor. By using an objective for the line sensor, a desired part of the structure, for instance a linear part having a length of 1 mm, can be imaged on the line sensor.

Figure 2:
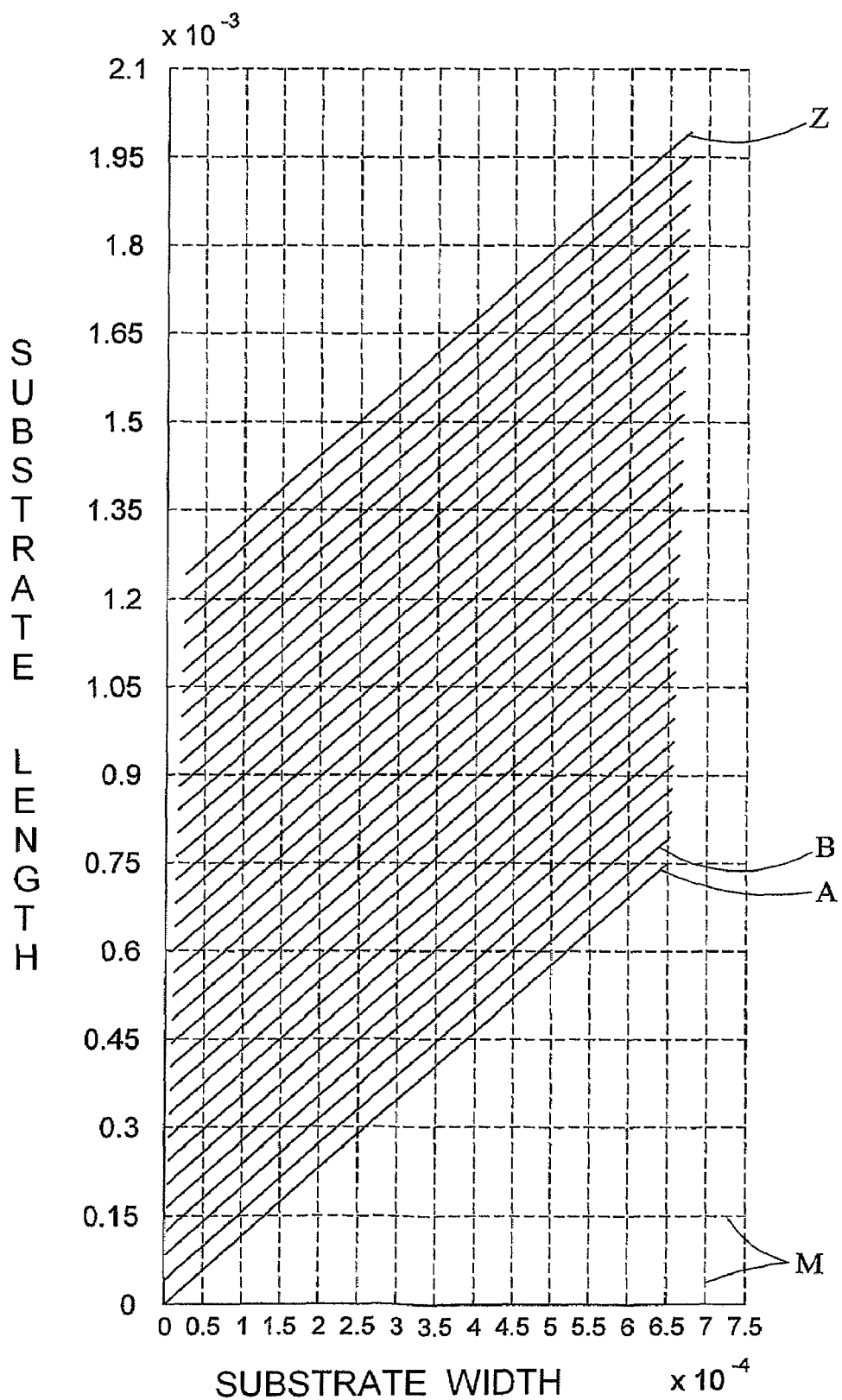

The invention will now be explained in more detail on the basis of an exemplary embodiment, with reference to the drawing, in which:

FIG. 1 shows an arrangement of an exemplary embodiment of an apparatus according to the invention; and FIG. 2 shows a top plan view of a substrate with the different successive camera positions shown therein.

The exemplary embodiment shown in FIG. 1 shows a substrate 1 which is supported by a substrate support which can displace the substrate 1 in X-direction and Y-direction. In the present exemplary embodiment, the substrate 1 is intended for manufacturing a display therefrom. On the substrate, an orthogonal matrix structure is present which is, in the present exemplary embodiment, a relief structure comprising pixel wells. The pixel wells have dimensions which are in the range of 20-500 micrometers. The distance between the edges of the pixel wells is in the range of 2-40 micrometers. The substrate 1 has a length and a width of at least 10 mm*10 mm but may also be much larger, for instance 1000 mm*2000 mm.

The accuracy with which the X-position information and the Y-position information are to be provided is of the order of approximately 1 micrometer.

FIG. 1 also shows a processing head 2 which is provided with four cameras 3, which are, in the present exemplary embodiment, designed as line cameras. The line cameras each comprise one series of sensors arranged along a main line. Each line camera observes, for instance, a length of approximately 1 mm and contains, for instance, 1024 sensors arranged next to one another along the main line. Such a line camera provides a one-dimensional signal which is subjected to signal processing. It is noted that two-dimensional CCD cameras may also be used, while, however, each time a one-dimensional signal of the CCD camera—i.e. a signal coming from a series of sensors arranged along one main line—will be subjected to signal processing.

In an alternative embodiment, the substrate may also be arranged statically and the processing head 2 may be arranged movably in X-direction and Y-direction. In another alternative elaboration, the substrate 1 may, for instance, be arranged movably in Y-direction and the processing head 2 may, for instance, be arranged displacably in X-direction and vice versa.

The processing head 2 is pivotal about a centerline extending at right angles to the substrate 1. The cameras 3 are pivotal with respect to the processing head 2 about centerlines extending at right angles to the substrate.

Further, a motion controller 4 is provided which controls the displacement of the substrate support. The Figure further shows a processing head driver 5—in the present exemplary embodiment, the processing head is an inkjet printer head and the processing head driver 5 is an inkjet printer head driver 5. Reference numeral 6 designates a signal-processing module.

The signal-processing module 6 has the one-dimensional camera signals 7 coming from the cameras 3 as input information and also has geometrical knowledge 8 of the structure applied to the substrate 1. On the basis of fast Fourier transformation or discrete sine/cosine transformation of the one-dimensional camera signal of each camera 3, the relative displacement 9 of the X-position of the substrate 1 with respect to the expected position is determined. This deviation 9 in X-direction may also be referred to by the term actual tracking deviation. The actual tracking deviation 9 thus determined is used as an input signal for the motion controller 4. On the basis of fast Fourier transformation of the one-dimensional signal of each camera 3, the signal-processing module 6 also determines the relative displacement of the Y-position of the substrate with respect to the expected position. On the basis of this Y-position information, a print trigger signal 10 is transmitted to the motion controller 4 by the signal-processing module 6. In the present exemplary embodiment, per pixel on the substrate 1, one print trigger 10 is transmitted to the motion controller 4. From the motion controller 4, a second print trigger signal 11 related to the clock is transmitted to the inkjet printer head driver 5 which controls the different nozzles of the inkjet printer head 2.

In the present exemplary embodiment, the substrate length extends in Y-direction and the substrate width extends in X-direction. In a scanning pass, by a relative displacement of the processing head 2 with the cameras 3 with respect to the substrate 1, the substrate is scanned in Y-direction over the whole substrate length. Then, a relative displacement of the substrate 1 with respect to the processing head 2 in X-direction is realized, after which a next scanning pass in Y-direction follows. The step of a scanning pass in Y-direction and a displacement in X-direction is repeated until the substrate 1 has been scanned over the whole substrate width.

The relative displacement in Y-direction may be either a stepwise displacement or a continuous displacement at a speed in the range of 0-40 m/s.

The sampling frequency of the camera signal may be in the range of 1 kHz to 2 MHz.

When there are structural elements having dimensions of the order of magnitude of about 150 micrometers and a scanning speed of approximately 0.4 m/s, a sampling frequency of 10 kHz is sufficient to prevent aliasing of signal pulses.

The main line of the at least one camera includes an angle with the X-direction and includes an angle with the Y-direction. The above-mentioned angles deviate from 0 and from 90 degrees and have been chosen such that the camera signal contains spatially separated X-position information and Y-position information and that the X-position information and the Y-position information can be separated from the sensor signal with the aid of signal processing.

FIG. 2 shows, in top plan view, the successive positions A, B, . . . Z of a line camera 3 with respect to a substrate 1 provided with a matrix structure M. In that exemplary embodiment, the substrate 1 is provided with a pixel structure in which the pixels have dimensions of 50*150 micrometers. The line camera 3 having a length of approximately 1 mm includes an angle with the X-direction of approximately 49 degrees. This results in the line camera intersecting five pixel boundaries in Y-direction and intersecting thirteen pixel boundaries in X-direction. During scanning, each line camera provides m spatially separated X-signals and n spatially separated Y-signals, with m=13 and n=5. Due to the fact that, in the present exemplary embodiment, m and n are both prime numbers which are, in addition, mutually different, no or hardly any coinciding pulses for pixel boundaries in X-direction and pixel boundaries in Y-direction will occur, so that no or hardly any cross talk occurs in the signal. Therefore, per line camera position A, B, . . . Z, FIG. 2 shows no or hardly any positions on the line camera 3 which coincide with an intersection of pixel boundaries in X-direction and Y-direction. Both in X-direction and in Y-direction, the signals of the structural element boundaries are spatially separated well. It will be clear that the angle is different when the dimensions of the structural elements are different. When the pixels, for instance, have dimensions of 300*300 micrometers, a suitable angle which the main line of the line camera can include with the X-direction is 33.7 degrees. With that angle, with a line camera having a length of approximately 1 mm, three spatially separated pixel boundary intersections can be observed in X-direction and two spatially separated pixel boundary intersections can be observed in Y-direction. With unsuitably chosen angles, the spatial separation can decrease considerably (for instance with 0 and with 90 degrees) or a considerable cross talk can occur in the observation of the pixel boundaries in X-direction and the pixel boundaries in Y-direction. With square pixels, an angle of 45 degrees is, for instance, particularly unfavorable because of the large extent of cross talk in the signal.

During the signal processing in the signal-processing module 6, the relative X-position of the substrate structure with respect to the camera is derived from the $m^{th}$ result of the FFT processing of the camera signal and the relative Y-position of the substrate structure with respect to the camera is derived from the $n^{th}$ result of the FFT processing, with m being the number of pixel boundaries extending in Y-direction observed per line camera and with n being the number of pixel boundaries extending in X-direction observed per line camera.

The amplitude of the $m^{th}$ result and the $n^{th}$ result is an indication of the reliability of the signal and the phase information of the $m^{th}$ result and the $n^{th}$ result is proportional to the relative X-position and the relative Y-position, respectively.

Due to the fact that, with this method, of all structural element boundaries located below the main line of the camera, the information provided thereby is used, a very good signal-to-noise ratio (SNR) is obtained with the measurements and, in addition, a great accuracy is obtained in the position determination of the relative X-position and the relative Y-position.

The invention is not limited to the exemplary embodiment described and, within the framework of the invention, as defined by the claims, various variants are possible. Thus, the method and the apparatus may also be used for determining the position of a structure applied to a substrate, the substrate being intended for a different end product. Here, options to be considered are electronics, memories, biomedical analysis arrays, TFT structures for LCD and placing components on a PC board. The structural elements on the substrate do not need to be pixel wells but may also be formed by other elements detectable with light, such as for instance electronic components in a chip, color filter elements and the like. Also, the path of scanning over the substrate may be varied in many manners. Instead of scanning in Y-direction and stepwise displacement in X-direction, scanning may also take place in an oblique direction, i.e. in a direction which includes an acute angle with the X-direction or the Y-direction. As already indicated, scanning may take place at a continuous speed and scanning may take place stepwise. Instead of a relief structure with pixel wells or similar structural elements, a structure in the form of a printing may also have been applied to the substrate. The cameras then observe contrast differences instead of, for instance, height differences which are determined by the boundaries of the relief structural elements. As already indicated hereinabove, instead of an inkjet printer head, the processing head may also comprise a lighting head, an ablation head or a processing head for placing components. The lighting may, for instance, take place with visible light, UV radiation, infrared radiation, X-ray or the like. When the structural elements have dimensions larger than 300 micrometers, for obtaining a good accuracy and a reliable signal, the length of the main line along which the series of sensors of the camera are arranged needs to be increased.

In the exemplary embodiment described, the structural elements are arranged in an orthogonal matrix. However, the relative position of a structure of which the structural elements are arranged in a non-orthogonal matrix can also be determined with the method and apparatus according to the invention. Here, options to be considered are matrix structures with a round, trapezium or honeycomb structure.

The invention claimed is:

1. A method comprising:

providing a substrate with a preformatted structure, with structural elements arranged in a matrix, wherein the matrix extends in an X-direction and a Y-direction, the structural elements having boundaries, providing a processing head, providing a camera that is connected with the processing head and that comprises at least one series of sensors arranged along a main line, using the camera to scan the substrate, thereby providing at least one one-dimensional camera signal, wherein, for real-time determination of at least the X-position and the Y-position of the structure with respect to the camera, said main line includes an angle with the X-direction and with the Y-direction, wherein the angle is chosen such that the camera signal comprises X-position information and Y-position information regarding the structural element boundaries, and determining the X-position and the Y-position of the preformatted structure relative to the camera through signal processing of the camera signal.

2. A method according to claim 1, wherein the angle is chosen such that the camera provides X-position signal information on m spatially separated structural element of the matrix boundaries that extend in the Y-direction, and Y-position information on n spatially separated structural element boundaries of the matrix that extend in the Y direction.

3. A method according to claim 2, wherein m and n are mutually different prime numbers.

4. A method according to claim 1, wherein the signal processing comprises a fast Fourier transformation.

5. A method according to claim 1, wherein the signal processing comprises a fast discrete sine/cosine transformation.

6. A method according to claim 3, wherein the signal comprises a fast Fourier transformation of the camera signal,
wherein the X-position of the preformatted structure relative to the camera is determined from the $m^{th}$ result of the fast Fourier transformation of the camera signal, and
wherein the relative Y-position of the preformatted structure relative to the camera is determined from the $n^{th}$ result of the fast Fourier transformation of the camera signal.

7. A method according to claim 1, wherein a substrate length extends in the Y-direction and a substrate width extends in the X-direction, further comprising:
using the camera to scan the substrate with plural scanning passes,
wherein, in a scanning pass, by a relative displacement of the camera with respect to the substrate, the substrate is first scanned in the Y-direction over the whole substrate length, and then by a relative displacement of the substrate with respect to the camera in the X-direction, after which displacement a next scanning pass in the Y-direction follows.

8. A method according to claim 7, further comprising:
repeating scanning passes in the Y-direction and displacements in the X-direction until the substrate has been scanned over the whole substrate width.

9. A method according to claim 7, further comprising:
carrying out, during a scanning pass, a further operation on the substrate with the processing head.

10. A method according to claim 9, wherein the operation is an inkjet printer operation.

11. A method according to claim 9, wherein the operation comprises a lighting.

12. A method according to claim 9, wherein the operation comprises an ablation operation.

13. A method according to claim 9, wherein the operation comprises placing components.

14. A method according to claim 7, wherein the speed of the relative displacement in Y-direction is either a stepwise displacement or a continuous displacement at a speed in the range of 0-40 m/s.

15. A method according to claim 1, wherein the sampling frequency of the camera signal is in the range of 1 kHz to 2 kHz.

16. A method according to claim 1, further comprising:
using the X-position of the preformatted structure determined from the camera signal for correcting a relative X-position of the processing head with respect to the substrate.

17. A method according to claim 9, further comprising:
using the Y-position of the preformatted structure from the camera signal for timing the operation, such as for instance timing the release of liquid by an inkjet printer head, timing the lighting by a lighting processing head, an ablation operation and/or the release of components.

18. A method according to claim 1, wherein the substrate has dimensions of at least 10 mm*10 mm,
wherein the structural elements have dimensions of the order of 20-50 micrometers, and
wherein the distance between the structural elements is in the range of 2-40 micrometers.

19. A method according to claim 1, wherein the accuracy with which the X-position and the Y-position of the preformatted structure relative to the camera are of the order of 1 micrometer.

20. An apparatus for carrying out an operation on a substrate, which substrate is provided with a preformatted structure, with structural elements having boundaries and arranged in a matrix, wherein the matrix extends in an X-direction and Y-direction, wherein the apparatus is provided with:
a substrate support;
a processing head;
a displacement mechanism for relative displacement of the processing head with respect to the substrate;
at least one camera is connected to the processing head, said camera comprising at least one series of sensors arranged along a main line, the camera being operatively displaceable with respect to the substrate and configured to thereby scan the substrate for providing at least one one-dimensional camera signal, wherein, for real-time determination of at least an X-position and a Y-position of the preformatted structure with respect to the camera, said main line includes an angle with the X-direction and with the Y-direction, wherein the angle is chosen such that the camera signal comprises X-position information and Y-position information regarding spatial separation of the boundaries of the structural elements in the matrix, and
a control including a signal-processing module that is arranged for determining the X-position and the Y-position of the preformatted structure relative to the camera through signal processing of the camera signal.

21. An apparatus according to claim 20, wherein the angle of the main line with respect to the X-direction and the Y-direction is set such that the camera signal provides X-position information on m spatially separated structural element boundaries of the matrix that extend in the y-direction and Y-position information on n spatially separated structural element boundaries of the matrix that extend in the X-direction.

22. An apparatus according to claim 21, wherein m and n are mutually different prime numbers.

23. An apparatus according to claim 20, wherein the signal-processing module of the apparatus is arranged for carrying out a fast Fourier transformation.

24. An apparatus according to claim 20, wherein the signal-processing module of the apparatus is arranged for carrying out a fast discrete sine/cosine transformation.

25. An apparatus according to claim 22,
wherein the signal processing module of the apparatus is arranged for carrying out a fast Fourier transformation,
wherein the signal-processing module is arranged for determining the X-position of the preformatted structure relative to the camera from the $m^{th}$ result of the fast Fourier transformation of the one-dimensional camera signal, and for determining the Y-position of the preformatted structure relative to the camera from the $n^{th}$ result of the fast Fourier transformation processing of the one-dimensional camera signal.

26. An apparatus according to claim 20, wherein the processing head is rotatable about a centerline extending at right angles to the substrate.

27. An apparatus according to claim 20, wherein the at least one camera is rotatable with respect to the processing head about a centerline extending at right angles to the substrate.

28. An apparatus according to claim 20, wherein the control is arranged for using the X-position of the preformatted structure determined from the camera signal for correcting the relative X-position of the processing head with respect to the substrate.

29. An apparatus according to claim 20, wherein the control is arranged for using the Y-position of the preformatted structure determined from the camera signal for timing the operation, such as for instance timing the release of liquid by an inkjet printer head, the timing of the lighting by a lighting processing head, the timing of an ablation operation and/or the timing of the release of components.

\* \* \* \* \*

UNITED STATES PATENT AND TRADEMARK OFFICE
CERTIFICATE OF CORRECTION

PATENT NO. : 7,692,174 B2  
APPLICATION NO. : 11/990088  
DATED : April 6, 2010  
INVENTOR(S) : Cornelis Petrus Du Pau et al.

It is certified that error appears in the above-identified patent and that said Letters Patent is hereby corrected as shown below:

Title Page, Item (73) should read  
\*\* ASSIGNEE: OTB GROUP B.V. \*\*

Signed and Sealed this

Twenty-seventh Day of July, 2010

David J. Kappos  
*Director of the United States Patent and Trademark Office*